United States Patent [19]
Ota et al.

[11] Patent Number: 5,754,093
[45] Date of Patent: May 19, 1998

[54] THICK-FILM PRINTED SUBSTRATE INCLUDING AN ELECTRICALLY CONNECTING MEMBER AND METHOD FOR FABRICATING THE SAME

[75] Inventors: Shinji Ota, Nukata-gun; Takashi Nagasaka, Anjo, both of Japan

[73] Assignee: Nippondenso Co., Ltd., Kariya, Japan

[21] Appl. No.: 638,145

[22] Filed: Apr. 26, 1996

[30] Foreign Application Priority Data

Apr. 28, 1995 [JP] Japan ................................. 7-105675

[51] Int. Cl.⁶ ...................................................... H01C 10/12
[52] U.S. Cl. ............................................................. 338/306
[58] Field of Search ..................................... 338/306, 307, 338/308, 309; 361/767, 771, 766

[56] References Cited

U.S. PATENT DOCUMENTS

| | | | |
|---|---|---|---|
| 4,225,468 | 9/1980 | Donohue et al. | 252/509 |
| 4,512,917 | 4/1985 | Donohue | 338/20 |
| 4,584,553 | 4/1986 | Tokura et al. | 338/320 |
| 5,119,272 | 6/1992 | Ohyama et al. | 338/309 X |
| 5,383,093 | 1/1995 | Nagasaka | 361/771 |
| 5,500,553 | 3/1996 | Ikegami . | |
| 5,549,778 | 8/1996 | Yokoyama et al. . | |
| 5,557,252 | 9/1996 | Ariyoshi | 338/308 X |

FOREIGN PATENT DOCUMENTS 2-273986  11/1990  Japan .

*Primary Examiner*—Edward Tso
*Attorney, Agent, or Firm*—Cushman Darby & Cushman IP Group of Pillsbury Madison & Sutro LLP

[57] ABSTRACT

A thick-film resistor in a thick-film printed substrate, the resistance of which is maintained at an appropriate value, is disclosed. In a thick-film printed substrate formed by printing a thick-film conductor and a resistor of lanthanum boride type on a ceramic substrate and then sintering, an intermediate resistor layer of lanthanum boride type is provided between the thick-film conductor and the resistor of lanthanum boride type. Reaction of glass composition contained in the thick-film conductor is suppressed, and resistance abnormality is prevented during sintering by causing the intermediate resistor layer of lanthanum boride type to be interposed.

20 Claims, 10 Drawing Sheets

1

THICK-FILM PRINTED SUBSTRATE INCLUDING AN ELECTRICALLY CONNECTING MEMBER AND METHOD FOR FABRICATING THE SAME

CROSS REFERENCE TO RELATED APPLICATION

This application is based upon and claims the benefit of priority of the prior Japanese Patent Application No. 7105675 filed on Apr. 28, 1995, the contents of which are incorporated herein by reference.

BACKGROUND OF THE INVENTION

1. Field of the Invention

The present invention relates to a thick-film printed substrate and a method of fabricating the same. The thick-film printed substrate is well-known as, for example, a ceramic substrate on which are printed a thick-film conductor and a thick-film resistor.

2. Related Arts

A thick-film printed substrate is conventionally formed as follows: a thick-film conductor is printed by screen-printing method on a ceramic substrate; the printed thick-film conductor is then sintered; a plurality of thick-film resistors required for circuitry are printed thereon and are collectively sintered. At this time, as shown in FIGS. 10A and 10B, a thick-film resistor 3 and thick-film conductors 2 are disposed so that the thick-film resistor 3 overlies the thick-film conductors by an appropriate amount. FIG. 10A is a plan view, and FIG. 10B is a sectional view taken along line XB—XB of FIG. 10A.

Herein, in a case where Cu type material is utilized for the thick-film conductor 2, a resistive paste of $LaB_6$ type (lanthanum boride type), the sheet resistance of which is between $10\ \Omega/\square$ and $10\ k\Omega/\square$, is employed as the thick-film resistor 3. A thick-film resistor 3 which is formed by this resistive paste of $LaB_6$ type will hereinafter be termed an "$LaB_6$ resistor."

SUMMARY OF THE INVENTION

However, it has been discovered from extensive research and repetitive experiments by the inventors that, when sheet resistance of the $LaB_6$ resistor 3 is a small value of $10\sim50\ \Omega/\square$, the thick-film conductor 2 experiences a resistance abnormality which may cause a decline in fabrication yield or a decline in reliability of the resistor.

In addition, resistance increased markedly and resistance abnormality was similarly experienced also when sheet resistance of the $LaB_6$ resistor 3 was a large value of $5\sim10\ k\Omega/\square$.

In light of the foregoing problem, it is an object of the present invention to appropriately maintain a resistance value of a thick-film resistor in a thick-film printed substrate.

To attain the above-mentioned object, a thick-film printed substrate according to the present invention comprises a thick-film conductor and a thick-film resistor, both of which are formed by printing and sintering on a ceramic substrate, and further comprises a connecting member which is disposed to electrically connect the thick-film conductor to the thick-film resistor and to prevent reaction of the thick-film conductor with the thick-film resistor.

BRIEF DESCRIPTION OF THE DRAWINGS

These and other objects, features and characteristics of the present invention will be appreciated from a study of the following detailed description, the appended claims, and drawings, all of which form a part of this application. In the drawings:

DETAILED DESCRIPTION OF THE PRESENTLY PREFERRED EXEMPLARY EMBODIMENTS

Figure 10A:
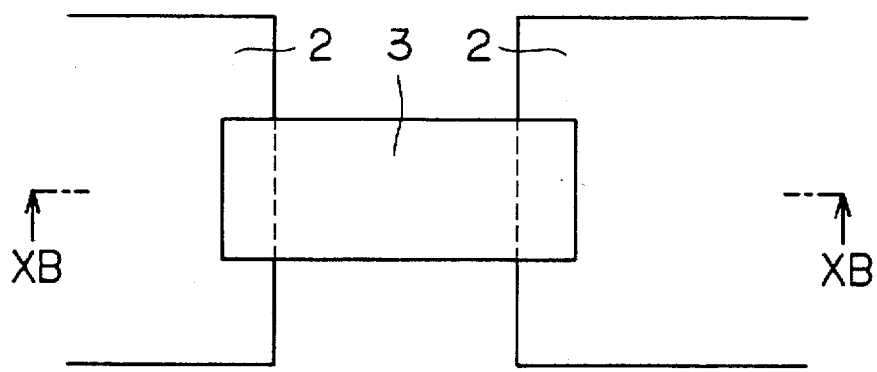
FIG. 10A is a plan view showing a conventional structure of a thick-film printed substrate.
Figure 10B:
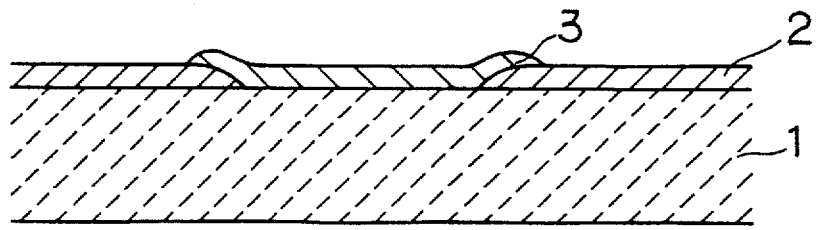
FIG. 10B is a sectional view taken along line XB—XB of FIG. 10A.

As described above, in a case where the $LaB_6$ resistor 3 of FIGS. 10A and 10B has a small sheet resistance value of 10~50 Ω/□, the thick-film conductor 2 experiences a resistance abnormality.

Figure 12:
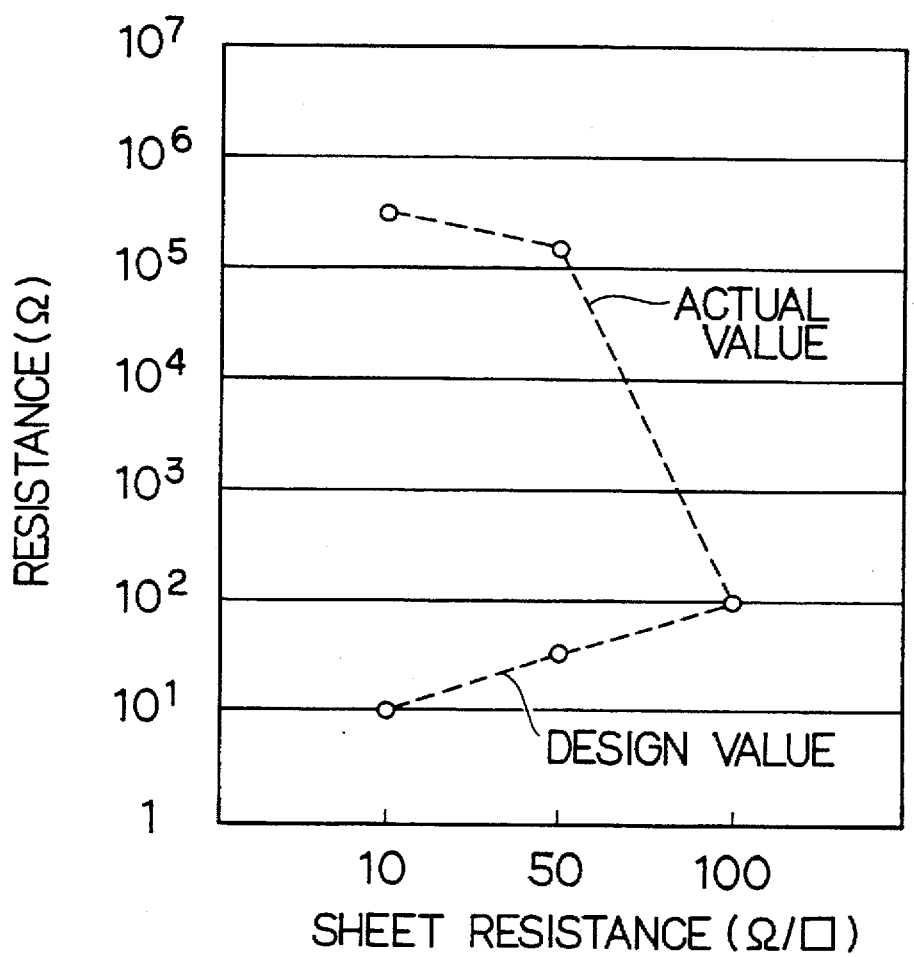
FIG. 12 is a characteristic diagram showing the aberration between the designed resistance value and the actual resistance value of the resultant products of $LaB_6$ resistors the sheet resistance of which are $10\ \Omega/\square$, $50\ \Omega/\square$, and $100\ \Omega/\square$, respectively.

FIG. 12 indicates results of an investigation of the average resistance of 20 samples for which sheet resistance of the $LaB_6$ resistor 3 was caused to be changed to 10 Ω/□, 50 Ω/□, or 100 Ω/□. In FIG. 12, the ordinate axis indicates the average resistance, which is resistance after sintering in a size of 1 mm×1 mm. It should be noted that graphs shown in FIG. 3, FIG. 5, FIG. 8, and FIG. 13 which will be described later also show the results of investigations similar to those shown in FIG. 12.

As shown in FIG. 12, resistance increased greatly from a design value when sheet resistance of the $LaB_6$ resistor 3 was caused to be 10 Ω/□ or 50 Ω/□.

Figure 13:
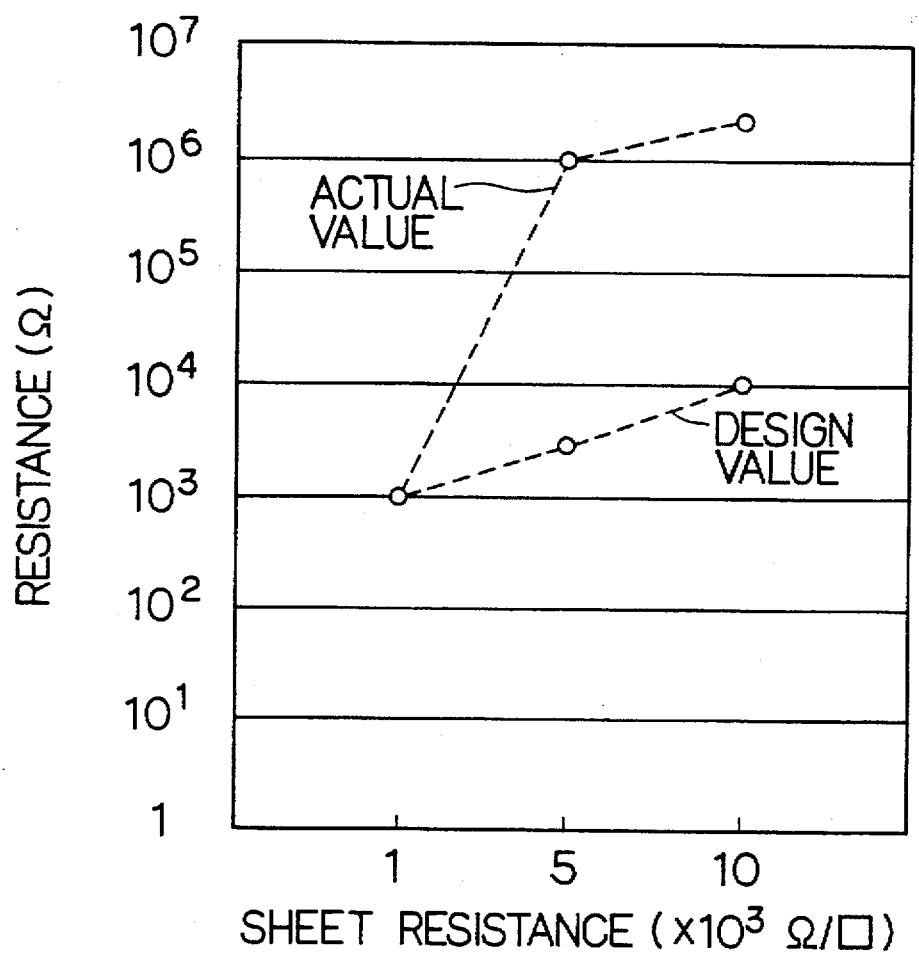
FIG. 13 is a characteristic diagram showing the aberration between the designed resistance value and the actual resistance value of the resultant products of $LaB_6$ resistors the sheet resistance of which are $1\ k\Omega/\square$, $5\ k\Omega/\square$, and $10\ k\Omega/\square$, respectively.

Additionally, samples where the sheet resistance of the $LaB_6$ resistor 3 was caused to be change to 1 kΩ/□, 5 kΩ/□, or 10 kΩ/□ were also investigated, as shown in FIG. 13. As understood from FIG. 13, resistance increased greatly from a design value when sheet resistance of the $LaB_6$ resistor 3 was caused to be 5 kΩ/□ or 10 kΩ/□.

Figure 11:
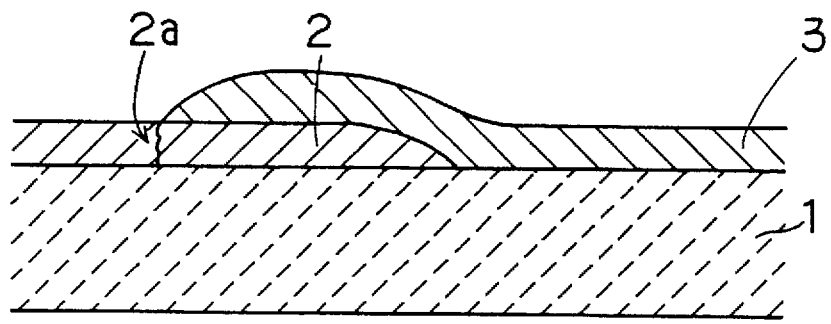
FIG. 11 is a sectional view schematically showing occurrence of a crack and occurrence of a broken wire in a thick-film conductor 2 when sheet resistance of a $LaB_6$ resistor 3 is small.
Figure 14:
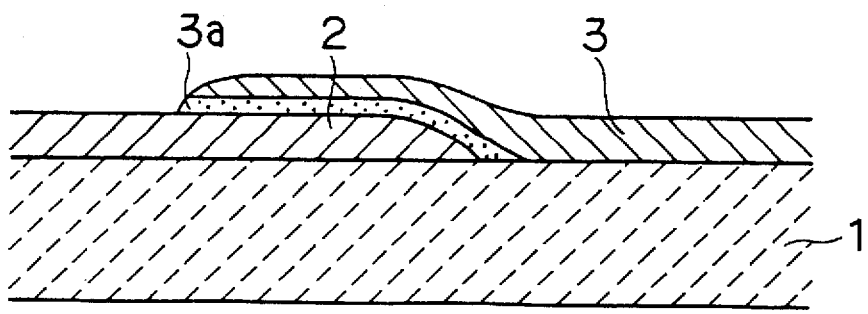
FIG. 14 is a sectional view schematically indicating a glassified resistor layer formed on a $LaB_6$ resistor 3 side when a sheet resistance of the $LaB_6$ resistor 3 is large.

Upon various examinations concerning the above-described points, the inventors arrived at the conclusion that a cause of occurrence of resistance abnormality such as the foregoing was due to occurrence of a crack 2a leading to a broken wire in the thick-film conductor 2 as shown in FIG. 11, or, in the alternative, due to a reaction between composition in glass included in the thick-film conductor and composition in the thick-film resistor as shown in FIG. 14.

That is to say, in a case where sheet resistance of the $LaB_6$ resistor 3 is comparatively low (i.e., a case of not more than 50 Ω/□), $LaB_6$ in the resistor reacts with composition in the thick-film conductor 2, and thick-film conductor 2 is denatured. This appears strongly below an end portion of the resistor, and leads to a broken wire in the thick-film conductor 2 as shown in FIG. 11.

Additionally, in a case where sheet resistance of the $LaB_6$ resistor 3 is comparatively large (i.e., a case of at least 5 kΩ/□), the $LaB_6$ reacts with composition in the thick-film conductor 2, a glassified resistor layer 3a is formed on the $LaB_6$ resistor 3 side as shown in FIG. 14, and resistance abnormality occurs because resistance of this glassified layer is large.

Based on the above-described investigations, occurrence of resistance abnormality due to reaction of the thick-film conductor with the thick-film resistor was scrutinized, and a first aspect of the present invention provides, between the thick-film conductor and the thick-film resistor, an interposed layer to prevent reaction of the thick-film conductor with the thick-film resistor during sintering of the thick-film resistor.

Consequently, by providing the interposed layer between the thick-film conductor and the thick-film resistor, reaction of the thick-film conductor with the thick-film resistor at a time of sintering of the thick-film resistor is prevented, occurrence of cracking arising due to this reaction or formation of a glassified resistor layer is suppressed, and resistance of the thick-film resistor can be maintained at an appropriate value.

A resistor or a conductor which does not react with the thick-film conductor and thick-film resistor can be employed as the interposed layer.

Additionally, a second aspect of the present invention comprises as the interposed layer an intermediate resistor layer of lanthanum boride type having a sheet resistance of not less than 100 Ω/□ and not more than 1 kΩ/□ provided between a thick-film conductor and a thick-film resistor of lanthanum boride type.

Figure 3:
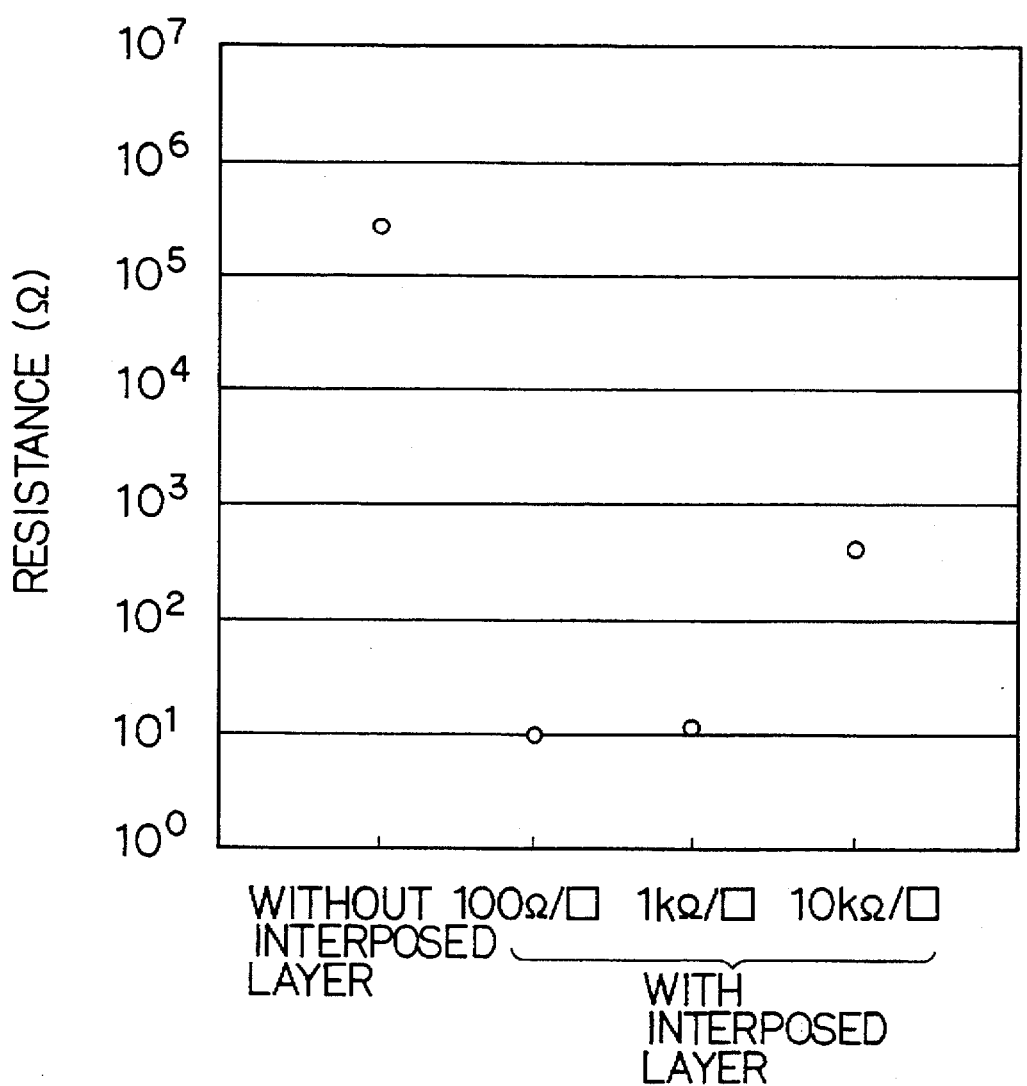
FIG. 3 is a characteristic diagram showing average resistances of examples (structure shown in FIG. 1) respectively having no intermediate layer and $LaB_6$ intermediate layers of $100\ \Omega/\square$, $1\ k\Omega/\square$, and $10\ k\Omega/\square$ in the sheet resistance.
Figure 5:
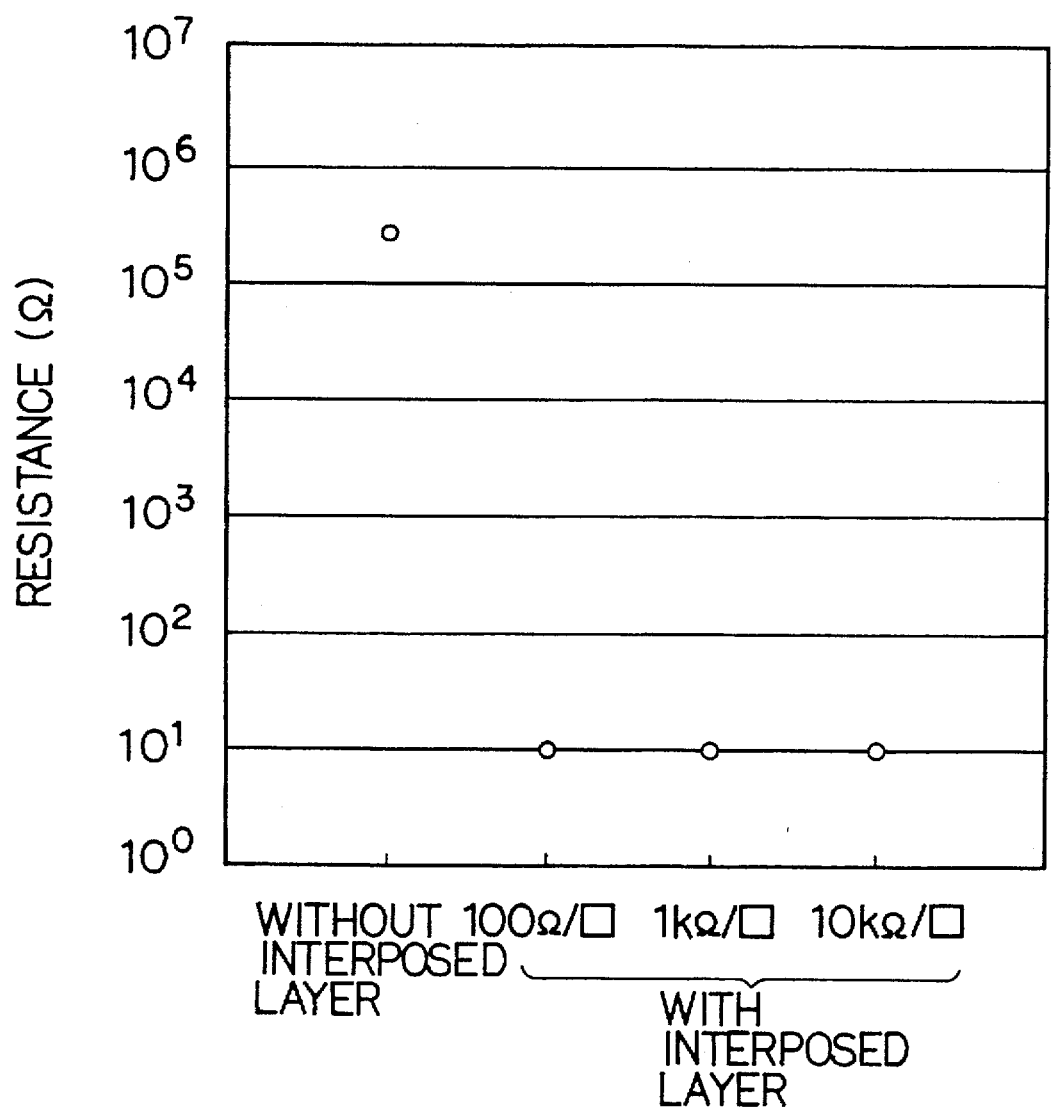
FIG. 5 is a characteristic diagram showing average resistances of examples (structure shown in FIG. 4) respectively having no intermediate layer and $LaB_6$ intermediate layers of $100\ \Omega/\square$, $1\ k\Omega/\square$, and $10\ k\Omega/\square$ in the sheet resistance.

In a case where sheet resistance of a resistor of lanthanum boride type is for example 50 Ω/□ or less, resistance increases from the design value as shown in FIG. 12, but increase in resistance can be prevented, as shown in the results of FIG. 3 and FIG. 5 which will be described later, by causing an intermediate resistor layer of lanthanum boride type having a sheet resistance of not less than 100 Ω/□ to be interposed.

This is because in a case where sheet resistance of a resistor of lanthanum boride type is 50 Ω/□ or less, $LaB_6$ exists excessively in the resistor, and so the $LaB_6$ readily reacts with composition in the thick-film conductor, but with a resistor of lanthanum boride type having a sheet resistance of 100 Ω/□ or more, the quantity of $LaB_6$ therein is appropriate, and so reaction between composition in the thick-film conductor and the $LaB_6$ becomes difficult to generate.

Figure 8:
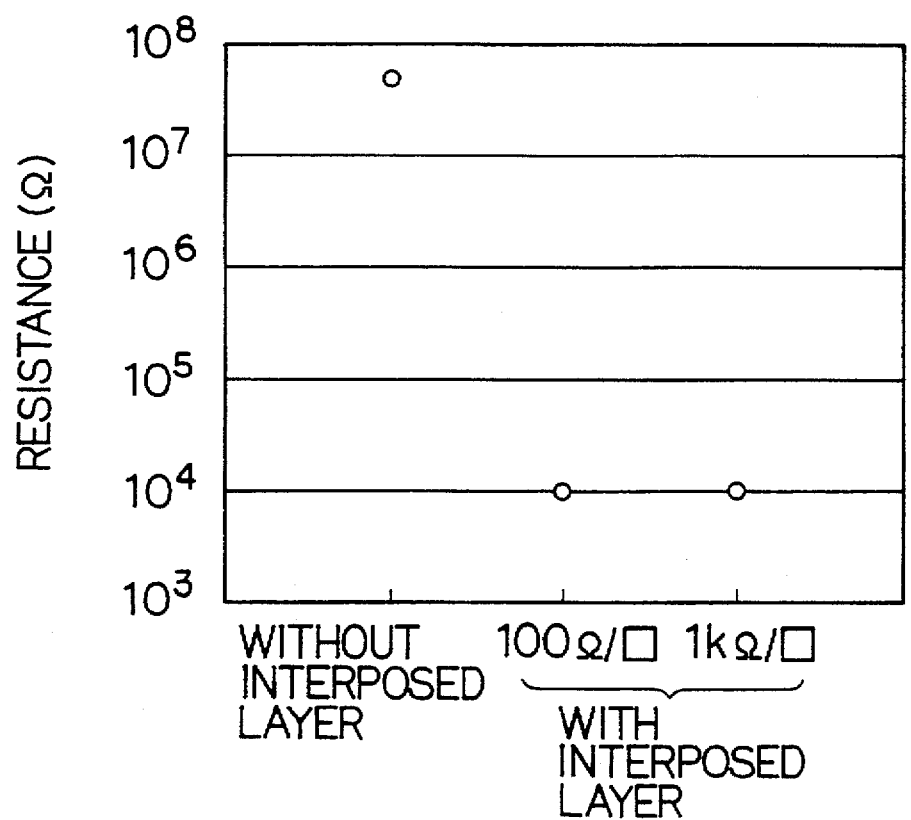
FIG. 8 is a characteristic diagram showing average resistances of examples (structure according to a fourth embodiment) respectively having no intermediate layer and $LaB_6$ intermediate layers of $100\ \Omega/\square$ and $1\ k\Omega/\square$ in the sheet resistance.

In a case where sheet resistance of a resistor of lanthanum boride type is for example 5 kΩ/□ or more, resistance increases from the design value as shown in FIG. 13, but formation of a glassified resistor layer is suppressed and increase in resistance can be prevented, as shown in the results of FIG. 8 which will be described later, by causing an intermediate resistor layer of lanthanum boride type having a sheet resistance of not more than 1 kΩ/□ to be interposed. In this FIG. 8, a 10 kΩ/□ resistor is utilized as a sample resistor.

This is because in a case where sheet resistance of a resistor of lanthanum boride type is 5 kΩ/□ or more, $LaB_6$ therein is sparse, and whereas the $LaB_6$ becomes extremely meager and resistance increases when the glass composition in the thick-film conductor and the $LaB_6$ react, even if the $LaB_6$ in a resistor of lanthanum boride type of 1 kΩ/□ or less is decreased, the effect thereof is slight, and so increase in resistance is prevented.

That is to say, by causing sheet resistance of an intermediate resistor layer of lanthanum boride type to be not less than 100 Ω/□ and not more than 1 kΩ/□, resistance of the resistor of lanthanum boride type can be maintained at an appropriate value no matter what value resistance of a resistor of lanthanum boride type formed thereon may be.

Additionally, a third aspect of the present invention is such that the thick-film conductor and the resistor of lanthanum boride type are formed on the ceramic substrate in a non-overlapping state, and the intermediate resistor layer of lanthanum boride type is formed with an overlying portion for electrical connection respectively to the thick-film conductor and the resistor.

By eliminating mutual overlying of the entirety of the thick-film conductor, resistor, and intermediate layer in this way, surface unevenness can be made equivalent to an ordinary substrate.

Further, a fourth aspect of the present invention is such that an intermediate resistor layer of lanthanum boride type having a sheet resistance of not less than 100 Ω/□ is provided between an end portion of a resistor of lanthanum boride type which has a sheet resistance of not more than 50 Ω/□ and a thick-film conductor, and that the resistor of lanthanum boride type and the thick-film conductor are directly contacting in a region other than the resistor end portion.

By structuring the resistor of lanthanum boride type and the thick-film conductor so as to contact in a region other than the resistor end portion in this way, an increase in resistance due to the intermediate resistor layer of lanthanum boride type can be prevented.

Moreover, a fifth aspect of the present invention, which is directed to a method of fabricating a thick-film, is such that an intermediate layer to prevent a resistive paste to be printed and the sintered conductor from reacting due to sintering of the resistive paste is caused to be interposed therebetween prior to printing of the resistive paste.

By employing a method of fabrication such as this, resistance of the thick-film resistor can be maintained at an appropriate value as described above.

Still further, a sixth aspect of the present invention is such that a step for printing the resistive paste includes also printing the intermediate layer, being a resistive paste of the same material as, but different composition ratio for example from, the resistive paste for the thick-film resistor. Herein, as described in the fifth aspect, the intermediate layer is printed between the sintered conductor and the resistive paste for the resistor to prevent the resistive paste and the sintered conductor from reacting due to sintering of the resistive paste for the resistor.

By structuring the intermediate layer from the same material as the resistive paste for the thick-film resistor, it becomes possible to simplify the intermediate layer forming process.

Embodiments of the present invention will be described hereinafter with reference to the drawings.

(First Embodiment)

Figure 1A:
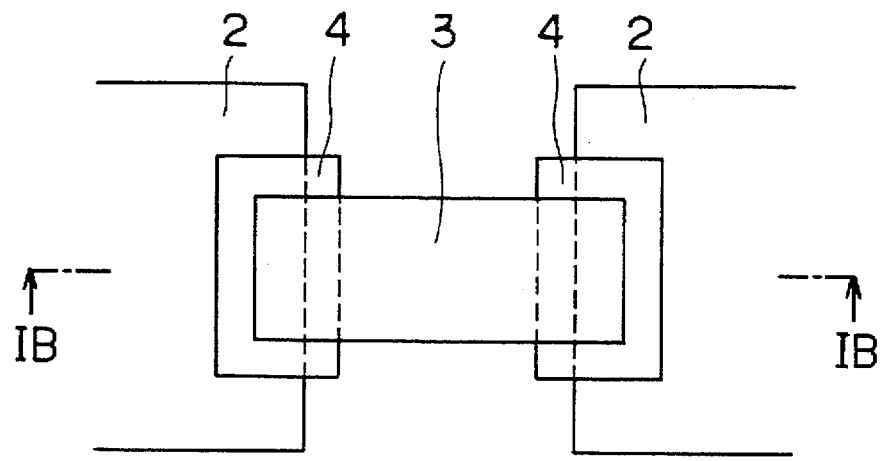
FIG. 1A is a plan view showing a structure of a thick-film printed substrate according to a first embodiment of the present invention.
Figure 1B:
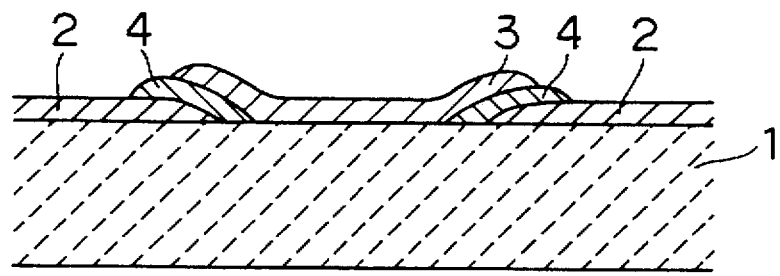
FIG. 1B is a sectional view taken along line IB—IB of FIG. 1A.
Figure 15:
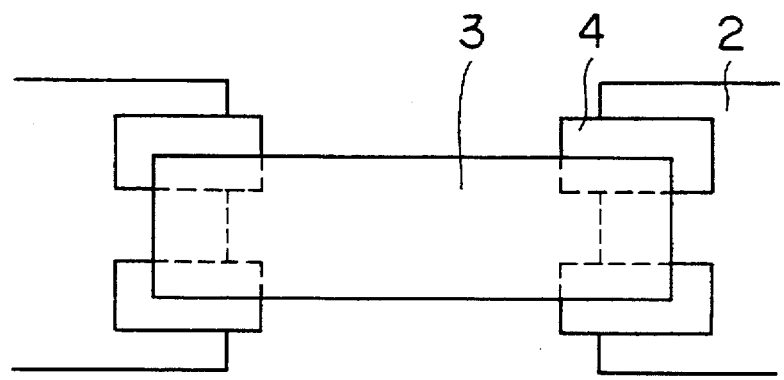
FIG. 15 is a plan view showing a structure of a thick-film printed substrate according to a sixth embodiment of the present invention.

FIGS. 1A and 1B illustrate a structure of a thick-film printed substrate according to a first embodiment of the present invention. FIG. 1A is a plan view, and FIG. 1B is a sectional view taken along line IB—IB of FIG. 1A.

In the first embodiment, a thick-film resistor having a small sheet resistance is employed. In FIGS. 1A and 1B, a Cu type thick-film conductor 2, which is composed of Cu and a glass component, is formed on a ceramic substrate 1, and an intermediate layer 4 having an overlying portion for electrical connection to the thick-film conductor 2 and an $LaB_6$ resistor 3, respectively, is formed therebetween.

A resistor or conductor which does not react with the thick-film conductor 2 and the $LaB_6$ resistor 3 can be employed as the material for this intermediate layer 4. However, from the standpoint of fabrication it is preferable to form the intermediate layer 4 of a material identical to the $LaB_6$ resistor 3 printed on the ceramic substrate 1. That is to say, $LaB_6$ resistors 3 of various resistances are individually printed and formed on the ceramic substrate 1, and so when the intermediate layer 4 is taken to be one $LaB_6$ resistor thereamong, there exists an advantage that the intermediate layer 4 can be formed similarly to the other $LaB_6$ resistors, and the intermediate layer 4 can be formed without causing the number of printing steps or the number of sintering steps to be increased.

An $LaB_6$ resistor, which is composed of $LaB_6$ and a glass component, will hereinafter be employed as the intermediate layer 4, and will be termed an $LaB_6$ intermediate resistor 4 in the description thereof.

Figure 2:
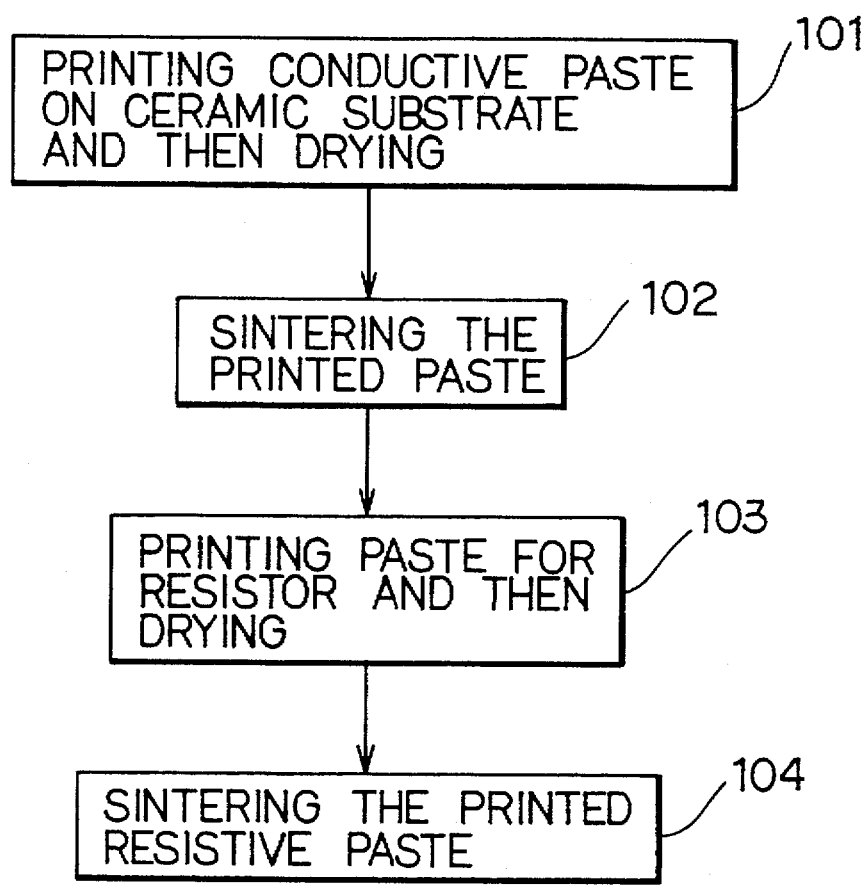
FIG. 2 is a diagram indicating a fabrication process of the thick-film printed substrate according to the first embodiment of the present invention.

FIG. 2 indicates a schematic process flow for the fabrication of the thick-film printed substrate shown in FIGS. 1A and 1B.

First, a thick-film conductor of Cu type is printed on the ceramic substrate 1 and then caused to be dried (step 101), and thereafter the conductor is sintered at 900° C. (step 102). A resistive paste of $LaB_6$ type is printed thereabove and then caused to be dried. The printing and drying processes for forming the resistor are performed repeatedly in correspondence with the resistors having respective sheet resistance required in circuit, including a printing of the $LaB_6$ intermediate resistor 4 having a particular sheet resistance (step 103). Thereafter, the resistors printed, which includes intermediate resistor 4, are collectively sintered (step 104). Consequently, when an $LaB_6$ resistor is employed as the intermediate layer, fabrication can be performed simultaneously with another $LaB_6$ resistor.

FIG. 3 illustrates the results of an investigation regarding utilization of a device having a sheet resistance of 10 $\Omega/\square$ as the $LaB_6$ resistor 3, with no intermediate layer 4 and an $LaB_6$ intermediate resistor 4 having sheet resistance taken to be respectively 100 $\Omega/\square$, 1 $k\Omega/\square$, and 10 $k\Omega/\square$.

As shown in FIG. 3, average resistance increases greatly from 10 $\Omega$ with a device having no intermediate layer 4, but a stabilized desired resistance can be obtained in a case where sheet resistance of the $LaB_6$ intermediate resistor 4 has been caused to be 100 $\Omega/\square$ or 1 $k\Omega/\square$. However, resistance increased in a case where sheet resistance of the $LaB_6$ intermediate resistor 4 was caused to be 10 $k\Omega/\square$.

This is because of the appearance of an effect of resistance of the intermediate layer 4 when the $LaB_6$ intermediate resistor 4 is formed over an entirety of a connection portion of the thick-film conductor 2 and $LaB_6$ resistor 3 as shown in FIGS. 1A and 1B. Consequently, in a case of structuring as shown in FIGS. 1A and 1B, it is necessary to cause sheet resistance of the $LaB_6$ intermediate resistor 4 to be from 100 $\Omega/\square$ to 1 $k\Omega/\square$.

(Second Embodiment)

This second embodiment is structured so as to restrain the influence of resistance of the above-described $LaB_6$ intermediate resistor 4 on the whole resistance as the thick-film resistor.

Figure 4A:
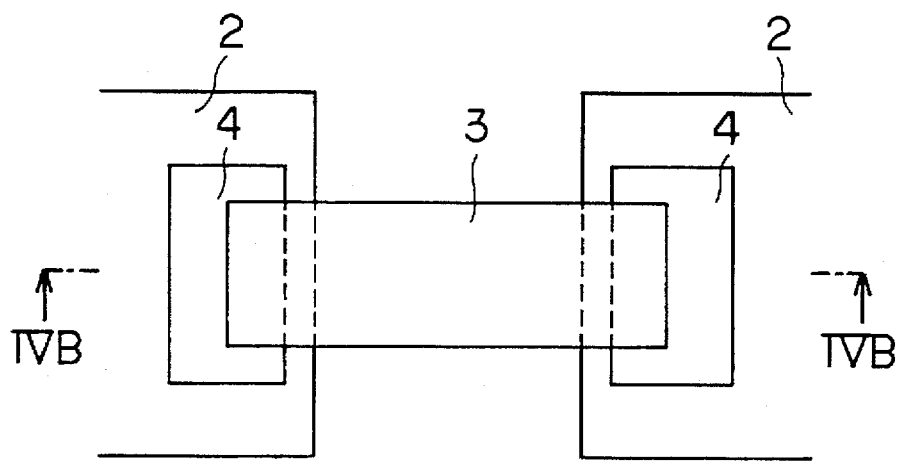
FIG. 4A is a plan view showing a structure of a thick-film printed substrate according to a second embodiment of the present invention.
Figure 4B:
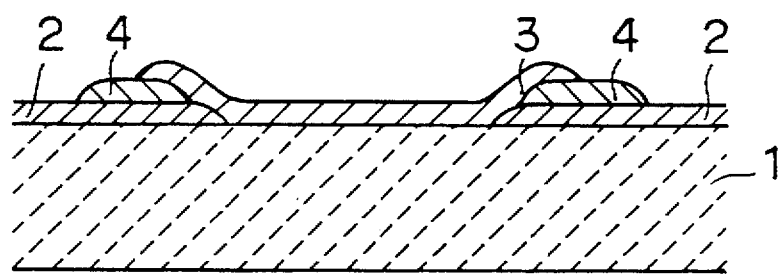
FIG. 4B is a sectional view taken along line IVB—IVB of FIG. 4A.

Cracking which occurs in a thick-film conductor 2 occurs below an end portion of an $LaB_6$ resistor 3 due to reaction with composition in the resistor. This point was scrutinized, and in this second embodiment, an $LaB_6$ intermediate resistor 4 was disposed only between an end portion of an $LaB_6$ resistor 3 and a thick-film conductor 2, as shown in FIGS. 4A and 4B. In this case, the $LaB_6$ resistor 3 and thick-film conductor 2 are directly contacting in a portion where the $LaB_6$ intermediate resistor 4 has not been formed, and so resistance does not change. FIG. 4A is a plan view, and FIG. 4B is a sectional view taken along line IVB—IVB of FIG. 4A.

FIG. 5 indicates experimental results for a structure in accordance with the second embodiment. A stabilized desired resistance could be obtained when sheet resistance of the $LaB_6$ intermediate resistor 4 was caused to be either 100 $\Omega/\square$, 1 $k\Omega/\square$, or 10 $k\Omega/\square$.

As is understood from the experimental results in FIGS. 3 and 5 for the above-described embodiments, occurrence of cracking can be prevented by causing sheet resistance of the $LaB_6$ intermediate resistor 4 to be not less than 100 $\Omega/\square$ in a case where sheet resistance of the $LaB_6$ resistor 3 is small.

This is because whereas in a case of sheet resistance of 50 $\Omega/\square$ or less for the $LaB_6$ intermediate resistor 4, $LaB_6$ comes to exist excessively in the $LaB_6$ intermediate resistor 4 and susceptibility of reaction between composition contained in the thick-film conductor 2 and the $LaB_6$ increases. On the other hand, when sheet resistance is 100 $\Omega/\square$ or more, the $LaB_6$ in the $LaB_6$ intermediate resistor 4 becomes an appropriate quantity, and reaction between glass composition contained in the thick-film conductor 2 and the LaB$_6$ becomes difficult to generate.

(Third Embodiment)

Figure 6A:
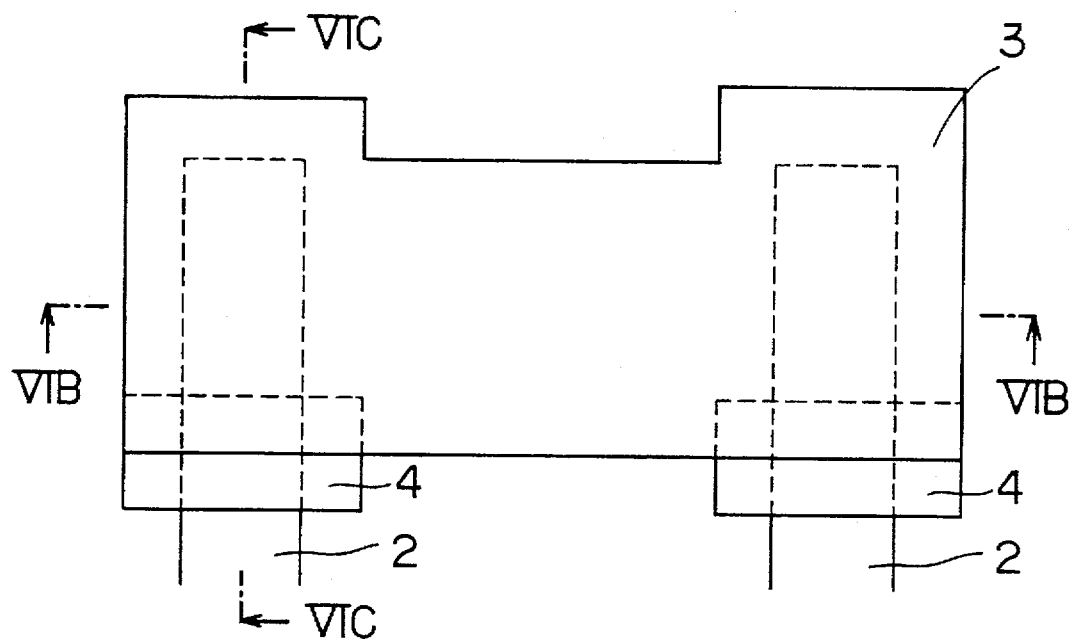
FIG. 6A is a plan view showing a structure of a thick-film printed substrate according to a third embodiment of the present invention.
Figure 6B:
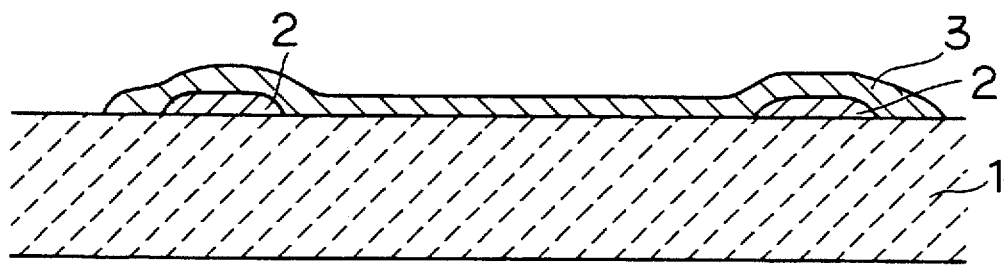
FIG. 6B is a sectional view taken along line VIB—VIB of FIG. 6A.
Figure 6C:
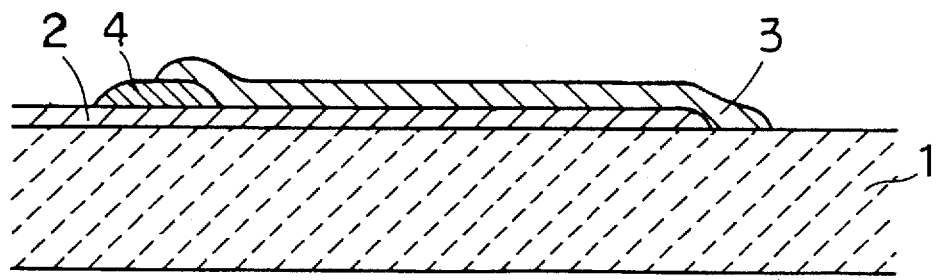
FIG. 6C is a sectional view taken along line VIC—VIC of FIG. 6A.

FIGS. 6A, 6B and 6C indicate an example where the foregoing second embodiment has been modified. FIG. 6A is a plan view, FIG. 6B is a sectional view taken along line VIB—VIB of FIG. 6A, and FIG. 6C is a sectional view taken along line VIC—VIC of FIG. 6A. When thick-film conductors 2 are formed in parallel above a ceramic substrate 1, the present embodiment forms an LaB$_6$ resistor 3 so as to cover two thick-film conductors 2, and LaB$_6$ intermediate resistors 4 are disposed only in regions on the respective thick-film conductors 2 where an end portion of the LaB$_6$ resistor 3 exists.

By structuring in this way, fluctuation in resistance can be prevented similarly to the second embodiment, and along with this, size in a lengthwise direction (left-right direction in FIG. 6A) of the resistor can be caused to be smaller even if the LaB$_6$ intermediate resistors 4 are provided.

Figure 7:
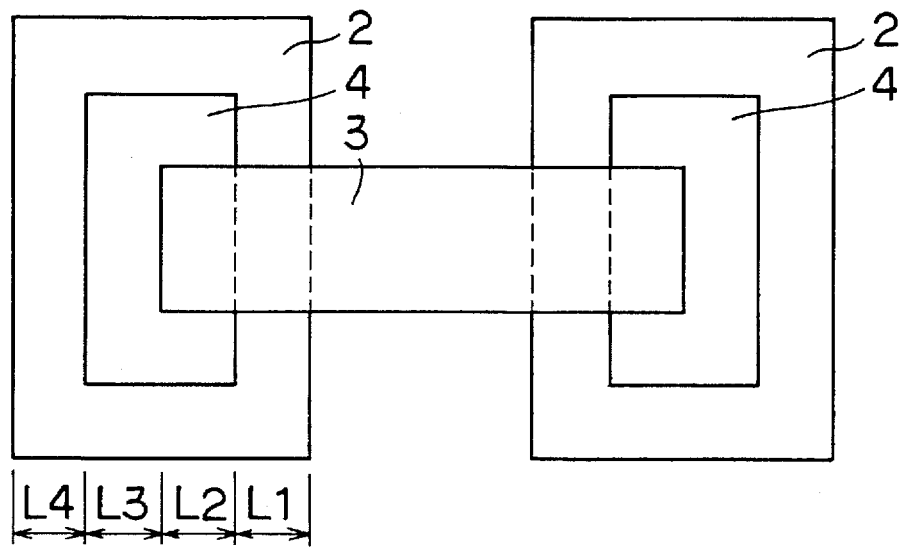
FIG. 7 is a plan view of a comparative example to describe reduction in size of a device having the structure indicated in FIG. 6A.

That is to say, a configuration indicated in FIG. 7 is obtained in a case where the LaB$_6$ intermediate resistor 4 has been formed between the thick-film conductor 2 and LaB$_6$ resistor 3 as in the second embodiment, but in this case overlying portions of L$_1$ through L$_4$ become necessary. This is because it is necessary to consider printing displacement and the like in fabrication of the thick-film printed substrate. Each of L$_1$ through L$_4$ is for example about 0.2 mm. In contrast to this, the LaB$_6$ intermediate resistor 4 is partially formed in a lead direction of the thick-film conductor 2 and the thick-film conductor 2 and LaB$_6$ resistor 3 are only aligned in a lengthwise direction of the resistor in a case where the LaB$_6$ resistor 3 has been formed so as to cover the thick-film conductor 2 as shown in FIGS. 6A through 6C, and so an overlying portion due to provision of the intermediate layer 4 becomes unnecessary, and reduction by a size corresponding thereto can be achieved.

(Fourth Embodiment)

In the fourth embodiment, an LaB$_6$ resistor 3 having a large (about 5 k$\Omega$/□ to 10 k$\Omega$/□) sheet resistance value is employed. Structure is identical with the device indicated in FIGS. 1A and 1B.

FIG. 8 illustrates the results of an investigation of average resistance regarding utilization of a device having a sheet resistance of 10 k$\Omega$/□ as the LaB$_6$ resistor 3, and with no intermediate layer 4 and an LaB$_6$ intermediate resistor 4 having a sheet resistance taken to be respectively 100 $\Omega$/□ and 1 k$\Omega$/□.

With the device having no intermediate layer 4, resistance increases markedly from 10 k$\Omega$, but in a case where sheet resistance of the LaB$_6$ intermediate resistor 4 is caused to be 100 $\Omega$/□ or 1 k$\Omega$/□, stabilized desired resistance is obtained for each.

Consequently, in a case where sheet resistance of the LaB$_6$ resistor 3 is large, increase in resistance can be prevented by causing sheet resistance of the LaB$_6$ intermediate resistor 4 to be 1 k$\Omega$/□ or less.

This is because when sheet resistance of the LaB$_6$ intermediate resistor 4 is caused to be large, LaB$_6$ in the LaB$_6$ intermediate resistor 4 becomes sparse, composition contained in the thick-film conductor 2 reacts with the LaB$_6$ and the LaB$_6$ becomes still more sparse, and resistance increases. Consequently, when sheet resistance of the LaB$_6$ intermediate resistor 4 is caused to be 1 k$\Omega$/□ or less, an effect of depletion of LaB$_6$ in the LaB$_6$ intermediate resistor 4 is not present to such an extent, and increase in resistance can be suppressed.

(Fifth Embodiment)

In a case where sheet resistance of an LaB$_6$ resistor 3 is large, even when an LaB$_6$ intermediate resistor 4 is disposed on an entirety of a connection portion of a thick-film conductor 2 and an LaB$_6$ resistor 3, the influence on resistance fluctuation due thereto is small. For this reason, a structure such as is indicated in FIGS. 1A and 1B is acceptable, but in this case, unevenness of a surface of only a portion where the LaB$_6$ intermediate resistor 4 has been provided becomes large.

Figure 9A:
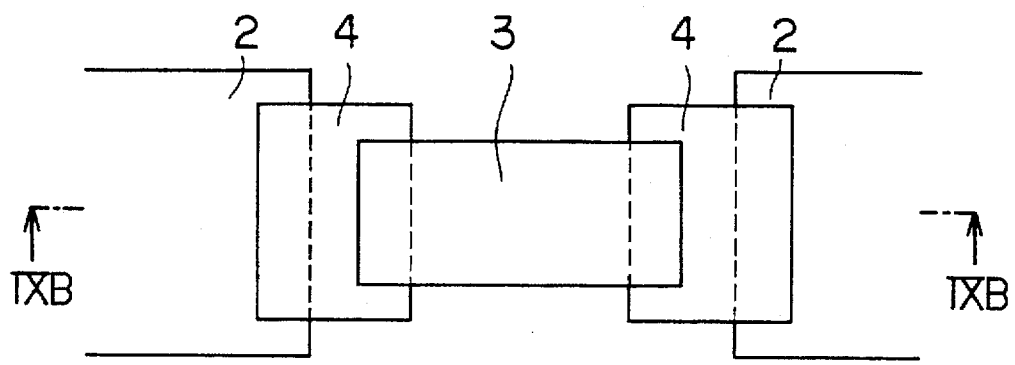
FIG. 9A is a plan view showing a structure of a thick-film printed substrate according to a fifth embodiment of the present invention.
Figure 9B:
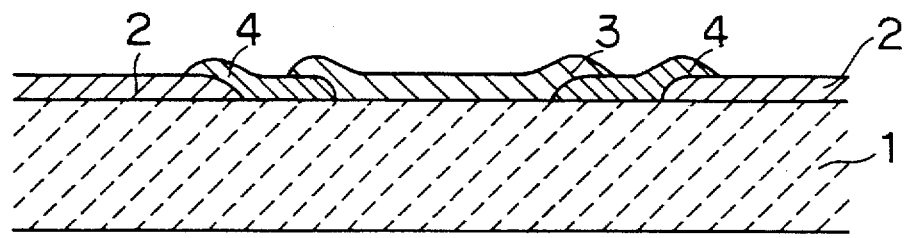
FIG. 9B is a sectional view taken along line IXB—IXB of FIG. 9A.

Accordingly, this embodiment is structured so that a thick-film conductor 2 and LaB$_6$ resistor 3 do not overlap and an LaB$_6$ intermediate resistor 4 is caused to be interposed therebetween, as shown in FIGS. 9A and 9B. By adopting a structure such as this, surface unevenness can be caused to be small. FIG. 9A is a plan view, and FIG. 9B is a sectional view taken along line IXB—IXB of FIG. 9A.

According to the foregoing embodiments, sheet resistance of the LaB$_6$ intermediate resistor 4 is selected to be not less than 100 $\Omega$/□ in a case where sheet resistance of the LaB$_6$ resistor 3 is small, and sheet resistance of the LaB$_6$ intermediate resistor 4 is selected to be not more than 1 k$\Omega$/□ in a case where sheet resistance of the LaB$_6$ resistor 3 is large. Consequently, when sheet resistance of the LaB$_6$ intermediate resistor 4 is selected to be from 100 $\Omega$/□ to 1 k$\Omega$/□, resistance abnormality due to occurrence of a crack or to forming of a glassified resistor layer can be prevented, no matter what sheet resistance of the LaB$_6$ resistor 3 may be.

(Sixth Embodiment)

This sixth embodiment is a modification of the first or second embodiment, and forms a LaB$_6$ intermediate resistor 4 between four end portions in a widthwise direction of a LaB$_6$ resistor 3 and thick-film conductors 2, so that end portions in a lengthwise direction of the LaB$_6$ resistor 3 directly contact the thick-film conductors 2.

According to this embodiment, passage for electrical current to the LaB$_6$ resistor 3 can be maintained through the disposed LaB$_6$ intermediate resistors 4, and so current flowing to the LaB$_6$ resistor 3 is not impeded even if a crack may occur in the thick-film conductors 2 under the end portions in the lengthwise direction of the LaB$_6$ resistor 3. Consequently, resistance abnormality can be prevented.

Additionally, each of the above-described embodiments indicated a device utilizing Cu type material as the thick-film conductor 2, but utilization of Ag type material is also acceptable, and moreover the thick-film resistor 4 as well is not exclusively limited to an LaB$_6$ resistor and may employ RuO$_2$ (ruthenium oxide) type resistor.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A thick-film printed substrate, comprising:

a substrate;

a sintered thick-film conductor disposed on said substrate by printing and sintering conductive paste thereon;

a sintered thick-film resistor disposed on said substrate by printing and sintering resistive paste thereon; and a connecting member disposed to electrically connection said thick-film conductor to said thick-film resistor and having a characteristic not to react with each of said thick-film conductor and said thick-film resistor.

2. A thick-film printed substrate according to claim 1, wherein said connecting member is an intermediate layer interposed between said thick-film conductor and said thick-film resistor.

3. A thick-film printed substrate according to claim 2, wherein said intermediate layer is made of a same material as said thick-film resistor.

4. A thick-film printed substrate according to claim 3, wherein said thick-film resistor and said intermediate layer are made of a lanthanum boride type material.

5. A thick-film printed substrate, comprising:

a ceramic substrate;

a sintered thick-film conductor disposed on said ceramic substrate;

a sintered thick-film resistor of lanthanum boride type disposed on said ceramic substrate; and an intermediate layer of a sintered lanthanum boride type resistor having a sheet resistance of not less than 100 $\Omega/\square$ and not more than 1 k$\Omega/\square$, said intermediate resistor layer being provided between said thick-film conductor and said thick-film resistor.

6. A thick-film printed substrate according to claim 5, wherein said intermediate layer partially covers said thick-film conductor.

7. A thick-film printed substrate according to claim 5, wherein said intermediate layer is disposed beneath said thick-film resistor.

8. A thick-film printed substrate according to claim 5, wherein said thick-film conductor includes copper.

9. A thick-film printed substrate according to claim 5, wherein:

said thick-film resistor of lanthanum boride type has a sheet resistance of not less than 5 k$\Omega/\square$;

said thick-film conductor and said thick-film resistor are disposed on said ceramic substrate in a non-overlapping state; and said intermediate layer is disposed with an overlapping portion for electrically connecting said intermediate layer to said thick-film conductor and said thick-film resistor.

10. A thick-film printed substrate, comprising:

a ceramic substrate;

a sintered thick-film conductor disposed on said ceramic substrate;

a sintered thick-film resistor of lanthanum boride type disposed on said ceramic substrate, said thick-film resistor having a sheet resistance of not more than 50 $\Omega/\square$; and an intermediate layer of a sintered lanthanum boride type resistor having a sheet resistance of not less than 100 $\Omega/\square$, said intermediate layer being provided between an end portion of said thick-film resistor and said thick-film conductor while said thick-film resistor and said thick-film conductor are directly contacting in a region other than said end portion of said thick-film resistor.

11. A thick-film printed substrate according to claim 10, wherein said thick-film conductor includes copper.

12. A thick-film printed substrate according to claim 10, wherein:

said thick-film conductor is a first thick-film conductor, and said thick-film printed substrate further comprises a second thick-film conductor disposed substantially in parallel with said first thick-film conductor;

said thick-film resistor is disposed across said first and second thick-film conductors; and said intermediate layer is located on each of said first and second thick-film conductors immediately beneath end portions in a widthwise direction of said thick-film resistor corresponding to said first and second thick-film conductors.

13. A method of fabricating a thick-film printed substrate, comprising the steps of:

printing a conductive paste on a substrate and sintering said conductive paste printed to form a thick-film conductor;

printing a resistive paste and sintering said resistive paste printed to form a thick-film resistor electrically connected to said thick-film conductor; and disposing an intermediate layer prior to printing said resistive paste to prevent said resistive paste and said sintered conductor from reacting due to sintering of said resistive paste.

14. A method according to claim 13, wherein said intermediate layer is made of a same material as said thick-film resistor.

15. A method according to claim 14, wherein said thick-film resistor and said intermediate layer are made of a lanthanum boride type material.

16. A method of fabricating a thick-film printed substrate, comprising the steps of:

printing a conductive paste on a substrate and sintering said conductive paste printed to form a sintered conductor;

individually printing a plurality of resistive pastes of lanthanum boride type; and collectively sintering said printed plurality of resistive pastes to form sintered resistors, wherein said resistive paste printing step also includes printing a particular paste between said sintered conductor and said resistive pastes to dispose an intermediate layer which prevents said resistive pastes and said sintered conductor from reacting during said resistive paste sintering step.

17. A method according to claim 16, wherein said particular paste is composed of material identical to said resistive paste.

18. A method according to claim 17, wherein said formed intermediate layer has a particular sheet resistance selected to prevent said reaction between said resistive paste and said sintered conductor.

19. A method according to claim 18, wherein said particular sheet resistance of said intermediate layer is different from a sheet resistance of said sintered resistor.

20. A method according to claim 19, wherein said intermediate layer and said sintered resistor comprise lanthanum boride, and said particular sheet resistance of said intermediate layer is between 100 $\Omega/\square$ and 1 k$\Omega/\square$.

* * * * *